United States Patent
Macphail

(10) Patent No.: US 7,339,427 B2
(45) Date of Patent: Mar. 4, 2008

(54) ANALOGUE POWER CONTROL IN A SATURATED AMPLIFIER

(75) Inventor: Philip Macphail, Cherry Hinton (GB)

(73) Assignee: SiGe Semiconductor (Europe) Limited, Bishop's Stortford, Hertfordshire (GB)

( * ) Notice: Subject to any disclaimer, the term of this patent is extended or adjusted under 35 U.S.C. 154(b) by 75 days.

(21) Appl. No.: 11/291,998

(22) Filed: Dec. 2, 2005

(65) Prior Publication Data

US 2007/0126504 A1    Jun. 7, 2007

(51) Int. Cl.
*H03F 3/217* (2006.01)
(52) U.S. Cl. ...................... 330/251; 330/255
(58) Field of Classification Search ........... 330/251, 330/255, 276
See application file for complete search history.

(56) References Cited

U.S. PATENT DOCUMENTS

| | | | |
|---|---|---|---|
| 4,032,851 A * | 6/1977 | Hoover | 455/332 |
| 4,117,415 A * | 9/1978 | Hoover | 330/264 |
| 5,631,595 A * | 5/1997 | Lakshmikumar | 327/362 |
| 6,432,055 B1 * | 8/2002 | Carp et al. | 600/437 |
| 6,537,216 B1 * | 3/2003 | Shifrin | 600/437 |
| 7,068,104 B2 * | 6/2006 | Burns et al. | 330/253 |

* cited by examiner

*Primary Examiner*—Patricia Nguyen
(74) *Attorney, Agent, or Firm*—Freedman & Associates

(57) ABSTRACT

A circuit is disclosed having a first series circuit path including a first switching transistor, a cascode transistor disposed in cascode arrangement with the first switching transistor, a transformer, and a fourth switching transistor. The circuit also has a second series circuit path having a second switching transistor, the transformer, and a third switching transistor. Both the first series circuit path and the second series circuit path are coupled between a first voltage source and a second voltage source. The cascode transistor has a bias applied to a port thereof for limiting current flowing therethrough.

54 Claims, 12 Drawing Sheets

Transient Response

ANALOGUE POWER CONTROL IN A SATURATED AMPLIFIER

FIELD OF THE INVENTION

The invention relates generally to amplifiers and more particularly to amplifiers for use in wireless communications.

BACKGROUND

It is a normal feature of these high output power transmitters to include a power amplifier stage prior to the antenna. Further it is common to provide a degree of amplitude control to the output power amplifier to provide adjustment, optimization and control of the transmitter. Switching mode power amplifiers are known from the state of the art as particularly efficient power amplifiers. Class-E amplifiers, for example, which have been presented in U.S. Pat. No. 3,919,656 are switching mode power amplifiers, which can theoretically approach a power efficiency of 100%. Switching mode power amplifiers are used for example in transmitter architectures, which require low power consumption, like transmitter architectures employed for mobile devices.

While a switching mode power amplifier can be very efficient, it is inherently very non-linear, i.e. the amplitude of its output signal is not affected linearly by a change of the amplitude of its input signals within the regular operating range. On the other hand, a switching mode power amplifier does not alter significantly the phase of input phase modulated signals. Thus, switching mode power amplifiers are rather suited for amplifying constant-envelope phase modulated signals than amplitude-modulated signals.

In some cases, signals that are to be amplified have no envelope variation in the first place. In some other cases, the switching mode power amplifier does not see the envelope variation, e.g. in the LINC system (LInear amplification using Non-linear Components) proposed by D. C. Cox of the Bell laboratories in "Linear Amplification with Nonlinear Components", IEEE Transactions on Communications, COM-22, pp. 1942 to 1945, December 1974, or when using a band pass pulse position modulation (PPM). In the latter case, the structure comprising the switching mode power amplifier as a whole takes care of generating the correct envelope for the transmitter output signal.

A structure employing a switching mode power amplifier is given for example with a conventional envelope elimination and restoration (EER) transmitter. In such an EER transmitter, a constant-envelope phase-modulated radio-frequency signal is input to the switching mode power amplifier for amplification. The envelope is then restored in the switching mode power amplifier by varying its supply power.

In most applications, it is required that the average power level of the signals output by a power amplifier can be controlled, possibly even over a very large dynamic range. In a conventional power control of the output power level of a power amplifier, a variable gain amplifier (VGA) is arranged in front of the power amplifier, which pre-amplifies the input signal according to the desired output power level. Since a switching mode power amplifier is inherently very non-linear, however, a conventional power control is not suitable for a switching mode power amplifier. On the other hand, the dynamic range that can be achieved by varying the power supply to the switching mode power amplifier mentioned above is restricted by a lower limit. This lower limit results from a leakage of an input radio frequency signal through the transistor of the switching mode power amplifier due to its parasitic capacitances.

There are various prior art approaches for dealing with the power control of switching mode power amplifiers; however, none of these approaches provides for a linear power control of a switching mode power amplifier over a very large dynamic range while preserving the efficiency of the amplifier. Further none of these approaches fits well with the desire for exploiting monolithic integration on semiconductors, such as CMOS due to the requirements of absorbing large die area for the integration of the control elements, which further add to the manufacturing and packaging issues and complexities.

It would be advantageous to provide a circuit topology those functions well for integration with CMOS amplifiers that support accurate amplitude control across a dynamic range sufficient to meet existing standards such as GSM and EDGE modulation requirements.

SUMMARY OF THE INVENTION

In accordance with the invention there is provided a circuit comprising: a first transformer port; a second transformer port; a voltage supply port; a voltage sink port; a first switch electrically disposed between the voltage supply port and the first transformer port; a second switch electrically disposed between the voltage supply port and the second transformer port; a third switch electrically disposed between the voltage sink port and the first transformer port; a fourth switch electrically disposed between the voltage sink port and the second transformer port; and a first cascode transistor disposed in cascode arrangement with one of the first switch, the second switch, the third switch, and the fourth switch.

In accordance with an embodiment, the circuit comprises a first transformer comprising a first winding and a second winding, the first winding coupled at one end thereof to the first transformer port and at another end thereof to the second transformer port, wherein the first winding of the transformer forms a first circuit path comprising the first switch, the first winding, and the fourth switch, and a second circuit path comprising the second switch, the first winding, and the third switch, the first circuit path and the second circuit path for driving the transformer with opposite polarity.

In accordance with another aspect of the invention there is provided a storage medium having stored therein data for when executed resulting in a circuit design comprising: a first transformer port; a second transformer port; a voltage supply port; a voltage sink port; a first switch electrically disposed between the voltage supply port and the first transformer port; a second switch electrically disposed between the voltage supply port and the second transformer port; a third switch electrically disposed between the voltage sink port and the first transformer port; a fourth switch electrically disposed between the voltage sink port and the second transformer port; and a first cascode transistor disposed in cascode arrangement with one of the first switch, the second switch, the third switch, and the fourth switch.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

According to the invention current delivered to a load is controlled. This is distinct from other circuits where voltage is limited.

Figure 1:
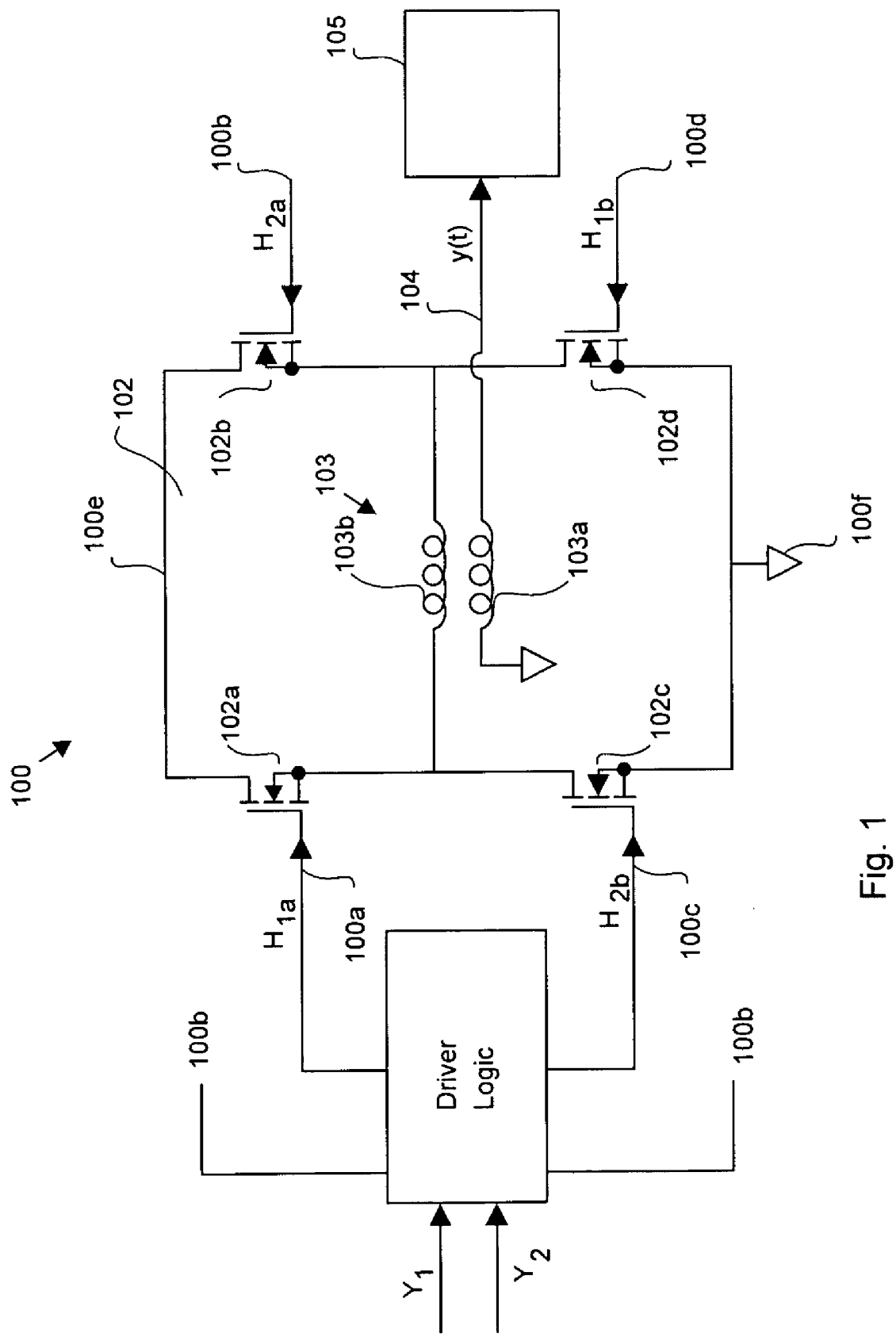
FIG. 1 illustrates a power amplifier (PA) output stage circuit in the form of a linear amplification with nonlinear components (LINC) PA and combiner circuit having an H-Bridge architecture.

Referring to FIG. 1, a power amplifier (PA) output stage 100 is shown. The output stage 100 is primarily in the form of an H-bridge 102 that is disposed between first and second supply voltage ports, 100e and 100f. The H-bridge circuit 102 is primarily formed from two circuit paths. A first circuit path has a first end thereof coupled with the first supply voltage port 100e, where a first side of a first high side switching circuit 102a is coupled thereto. Coupled to the second side of the first high side switching circuit 102a is a first end of a primary winding 103b of a transformer 103. Coupled to the second end of the primary winding 103b is a second low side switching circuit 102d, which is further coupled with the second supply voltage port 100f, terminating the first circuit path. A second circuit path has a first end thereof coupled with the first supply voltage port 100e, where a first side of a second high side switching circuit 102b is coupled thereto. Coupled to the second side of the second high side switching circuit 102b is a second end of the primary winding 103b of the transformer 103. Coupled to the first end of the primary winding 103b is a first low side switching circuit 102c, which is further coupled with the second supply voltage port 100f, terminating the second circuit path. Thus, the first and second circuit paths cross in the center of the H-bridge along the primary winding 103b. A secondary winding 103a for the transformer 103 is coupled with a load 105. In this case, the transformer 103 is absent a center tap.

PA output stage input ports 100a and 100d are coupled with the first high side switching circuit 102a and the second low side switching circuit 102d for controlling the switching operation thereof. PA output stage input ports 100b and 100c are coupled with the second high side switching circuit 102b and the first low side switching circuit 102c via a second port thereof for controlling the switching operation thereof. The H-bridge circuit therefore allows for controlling the polarity of the signals that propagate through the primary winding 103b of the transformer 103.

A power amplifier circuit is preferably connected to the output stage input ports 100a, 100b, 100c, and 100d for providing a signal thereto for producing a single-ended output to the load 105. Preferably the switching circuits, 102a through 102d, are in the form of MOS devices that are hard switched to reduce current losses. Further preferably, complementary devices are used to increase voltage swing at the output port 104, while reducing the voltage across each of the MOS devices. Driving a floating load 105 with a differential signal is a common technique for increasing the signal amplitude across the load 105. The transformer 103 converts the differential signal into a single ended signal for provision to the load 105.

By coupling the power supply across the primary winding of the transformer using the switching circuits 102a through 102d for alternating the polarity of the connection, current flow through the primary winding is limited by the inductance of the transformer. Losses across the switching circuits, 102a through 102d, are reducible. This results in an efficient generation of a carrier signal suitable for constant-envelope signals. Further, the signal thereby produced has three possible potentials, neutral, positive or negative, depending on the signals 100a, 100b, 100c and 100d.

The drain current of a CMOS device is a function of gate-source voltage, and this relationship is used to make both amplifiers and switches. For short gate lengths, the drain-source voltage also has a strong effect, and designers go to great lengths to minimise circuit sensitivities to this effect. For example, to ensure accurate operation of a FET it is optionally cascaded with a second FET, such that one device operates as a common source stage, and the second device acts as a common gate stage to buffer the first transistor.

Figure 2:
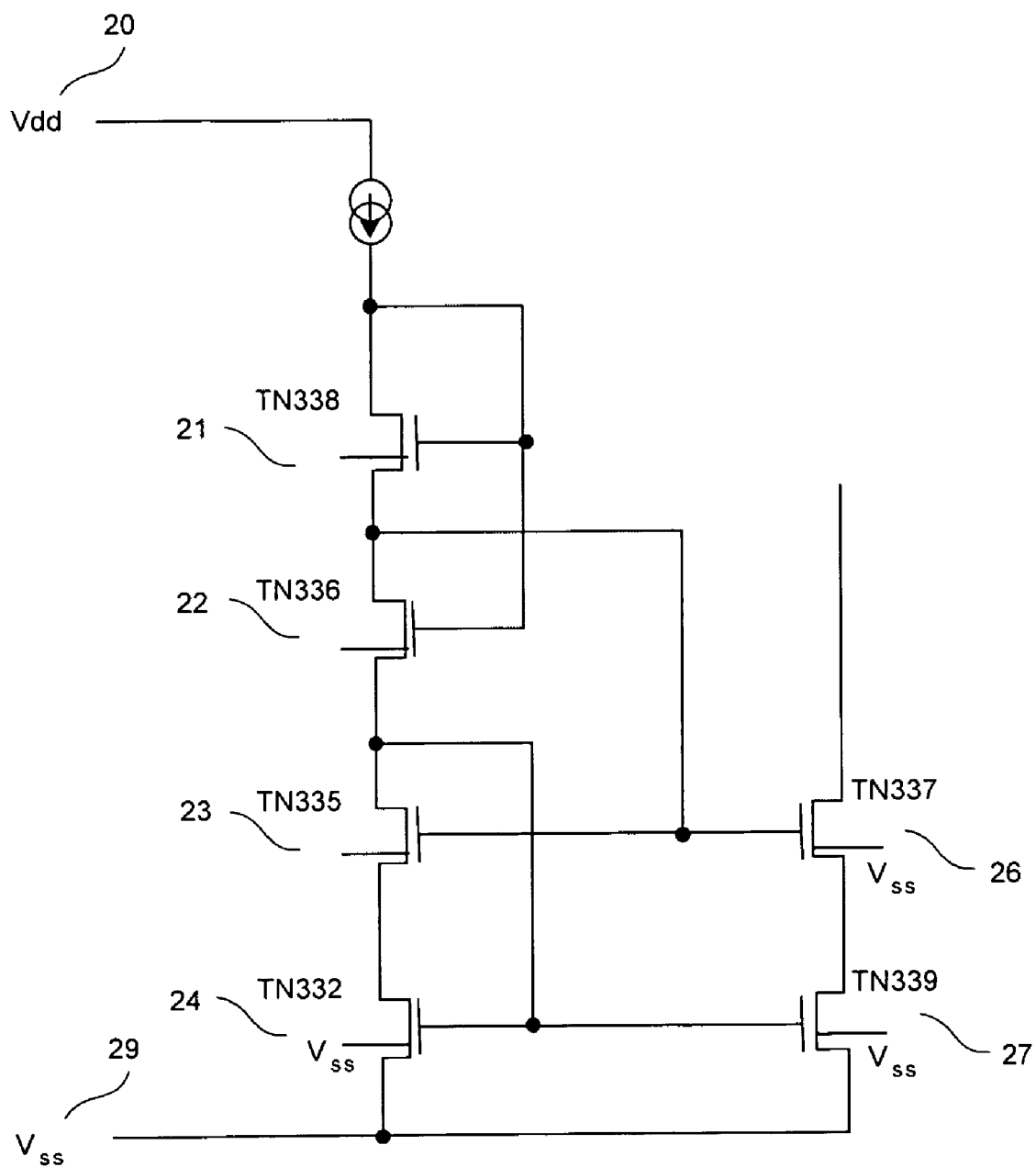
FIG. 2 illustrates a schematic diagram of a cascode current mirror.

Referring to FIG. 2, a cascode current mirror is shown. Transistors on the left side of the diagram—TN338 21, TN336 22, TN335 23, and TN332 24—are disposed across a current source and drop the reference to the voltage source for setting a bias for the current sink on the right wherein transistor TN337 26 is the cascode transistor for transistor TN339 27. The presence of a cascode arrangement results in a circuit having little sensitivity to drain voltage on transistor TN337 26.

The cascode arrangement also results in a circuit having considerable insensitivity to mismatch between devices within the circuit. This is advantageous as it reduces problems resulting from manufacturing tolerance errors. Further, this characteristic is of interest in that the resulting components are more reliably manufactured and, therefore, likely to be less costly to produce. If the gate of transistor TN339 27 is connected to an external voltage source then for voltages below threshold TN337 26 passes no current. As the voltage of the external voltage source increases beyond $v_t$, the current rises sharply to the mirror current. This is the case even when the gate potential is raised to the positive supply rail. Thus, the transistor TN339 27 is useful as a switch for a current sink.

By using cascode current mirrors for each of the switches in an H-bridge architecture such as that shown in FIG. 1 current propagating to the load is controlled by controlling the reference current in the mirror.

Figure 3:
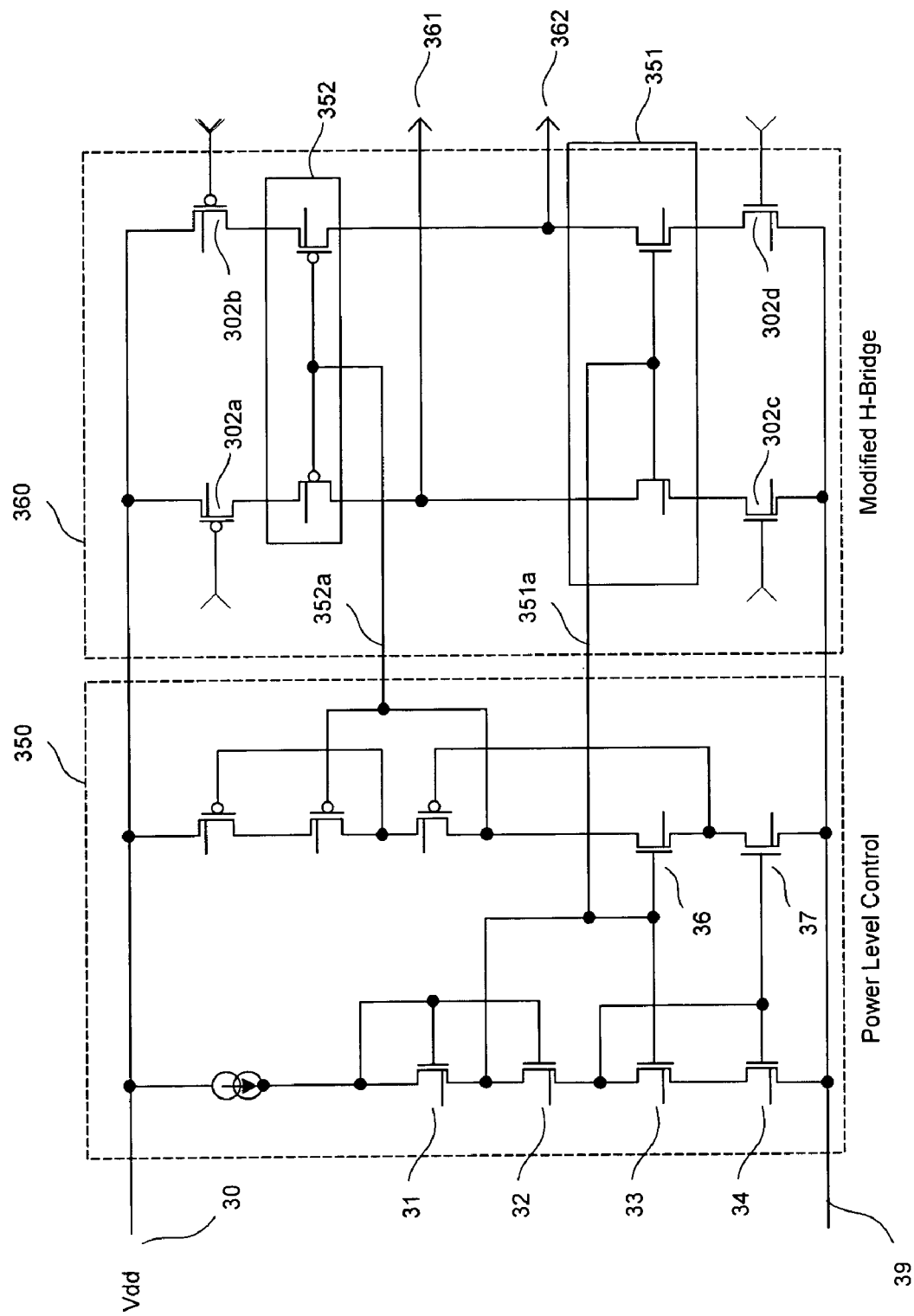
FIG. 3 illustrates a schematic diagram of an H-Bridge architecture amplifier having a cascode current mirror for driving switches thereof.

Referring to FIG. 3, a schematic diagram is shown wherein current mirrors are integrated into the H-bridge architecture amplifier circuit. Of course many other implementations are possible for achieving current control. In the circuit of FIG. 3, a power level control circuit 350 is shown having a similar schematic to that shown in FIG. 2. Here output signals 351a and 352a from the power level control circuit 350 are coupled to the modified H-Bridge circuit 360 so that each bias associated current mirrors 351 and 352, respectively. Thus each of switches 302a, 302b, 302c, and 302d is referenced to a common bias current driven by the power level control circuit 350 and the current mirrors 351 and 352. This common bias current is optionally scaled to a small percentage of the bridge current to maintain high efficiency.

Because of the circuit architecture shown, founded on a cascode arrangement of transistors, sensitivity of the drain voltage on transistors within the circuit is advantageously reduced. Control signals for affecting switching of switches 302a, 302b, 302c, and 302d are received at the gates of each of those circuits to effect switching in accordance with the H-Bridge architecture. Further, output ports 361 and 362 are typically coupled across a primary winding of a transistor similar to that shown in FIG. 1.

Figure 4:
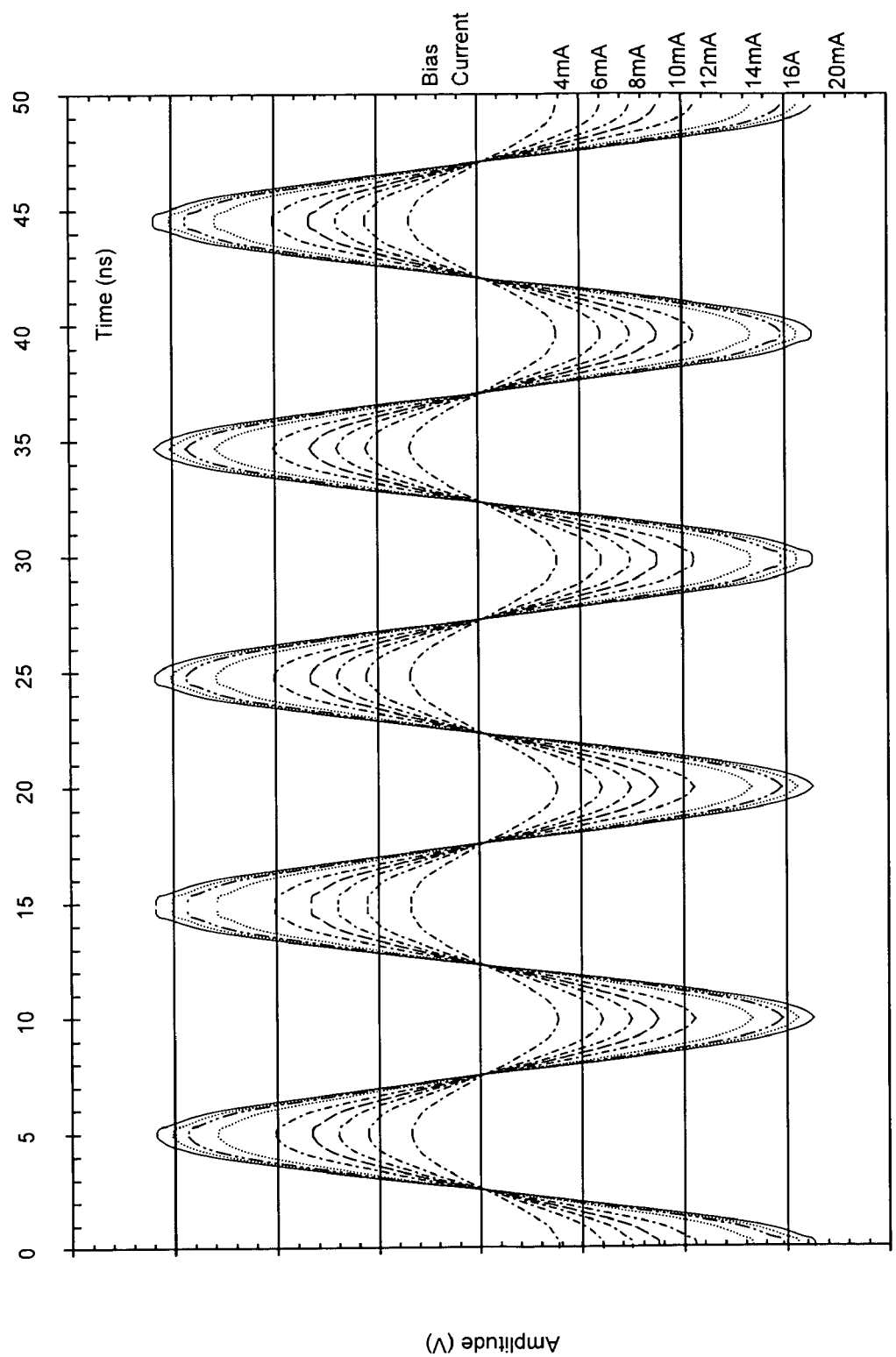
FIG. 4 is a graphical representation of a waveform highlighting effects of a 10:1 sweep of the bias current into the H-Bridge circuit of FIG. 3.

Referring to FIG. 4, a graphical representation of a waveform is shown. The waveform highlights effects of a 10:1 sweep of the bias current, for example output signals 351a and 352a shown in FIG. 3, into the H-Bridge circuit of FIG. 3. The transistors employed for generating this graphical representation are scaled to saturate at higher currents, so amplitude control is limited at higher bias levels; however, the control range shows a very usable characteristic, with no abrupt changes in level. Further, the sensitivity to drain voltage on the switching transistors 302a, 302b, 302c, and 302d is reduced.

Figure 5:
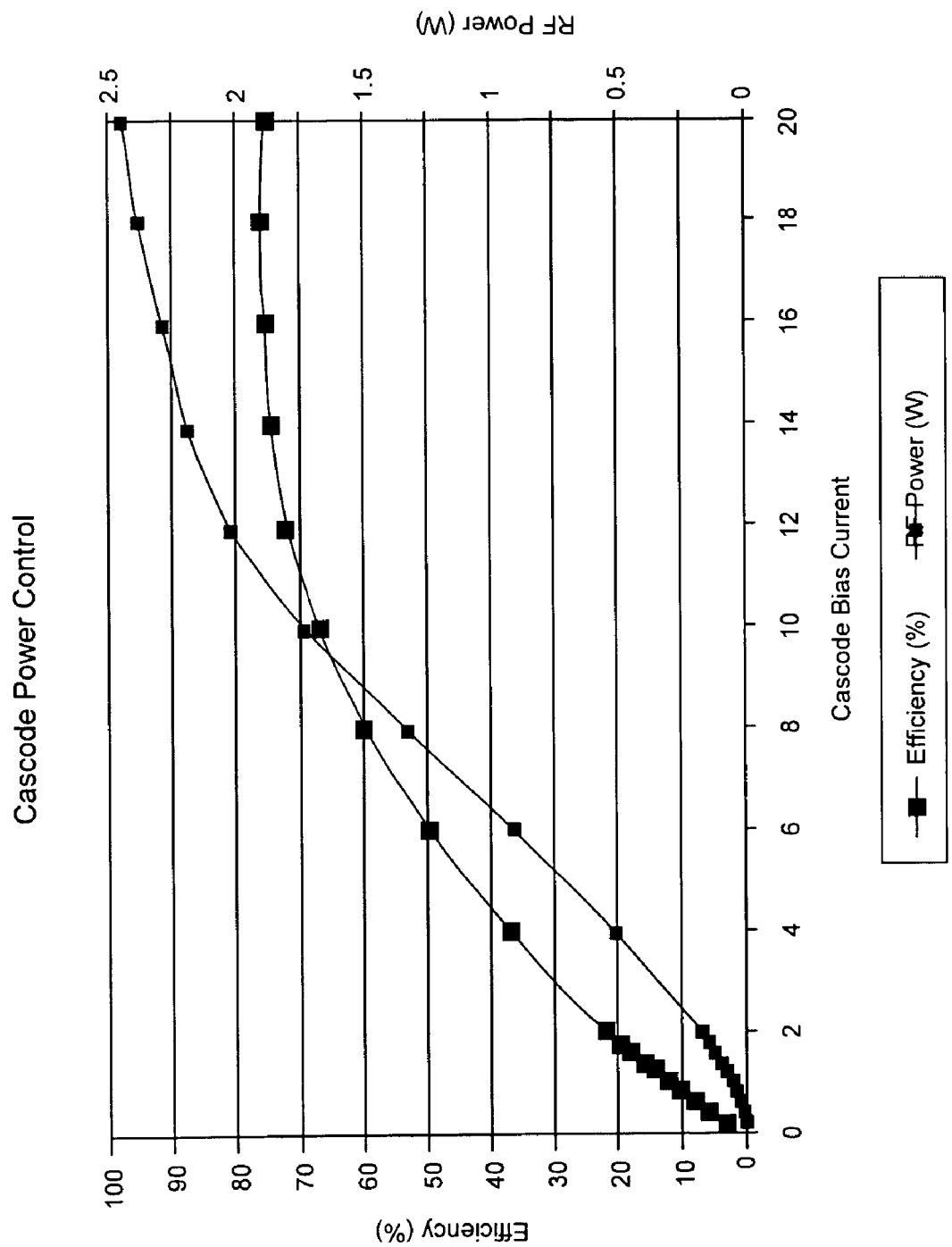
FIG. 5 is a graph representing cascode power control by showing efficiency vs. cascode bias current.

Referring to FIG. 5, a graph is shown indicating amplitude and efficiency of the amplifier of FIG. 3 with a 100:1 change in bias current. The power control range is approximately 30 dB. The results shown in the graph of FIG. 5 are in line with expectations as the stage saturates at higher current levels as expected. Further, there is a 40 dB change in control signal amplitude. Efficiency of the amplifier circuit drops with lower output power as there is a significant voltage drop across the switching devices. That said, for higher output power, the efficiency of the device is within an acceptable range.

Alternatively, other embodiments employing cascode arrangements for reducing sensitivity to drain voltage are employed within an H-Bridge architecture. Further alternatively, only some of the transistors within the modified H-Bridge are provided with cascode arrangements. Further alternatively, the H-Bridge architecture results in different arrangements of the transistors therein.

Figure 6:
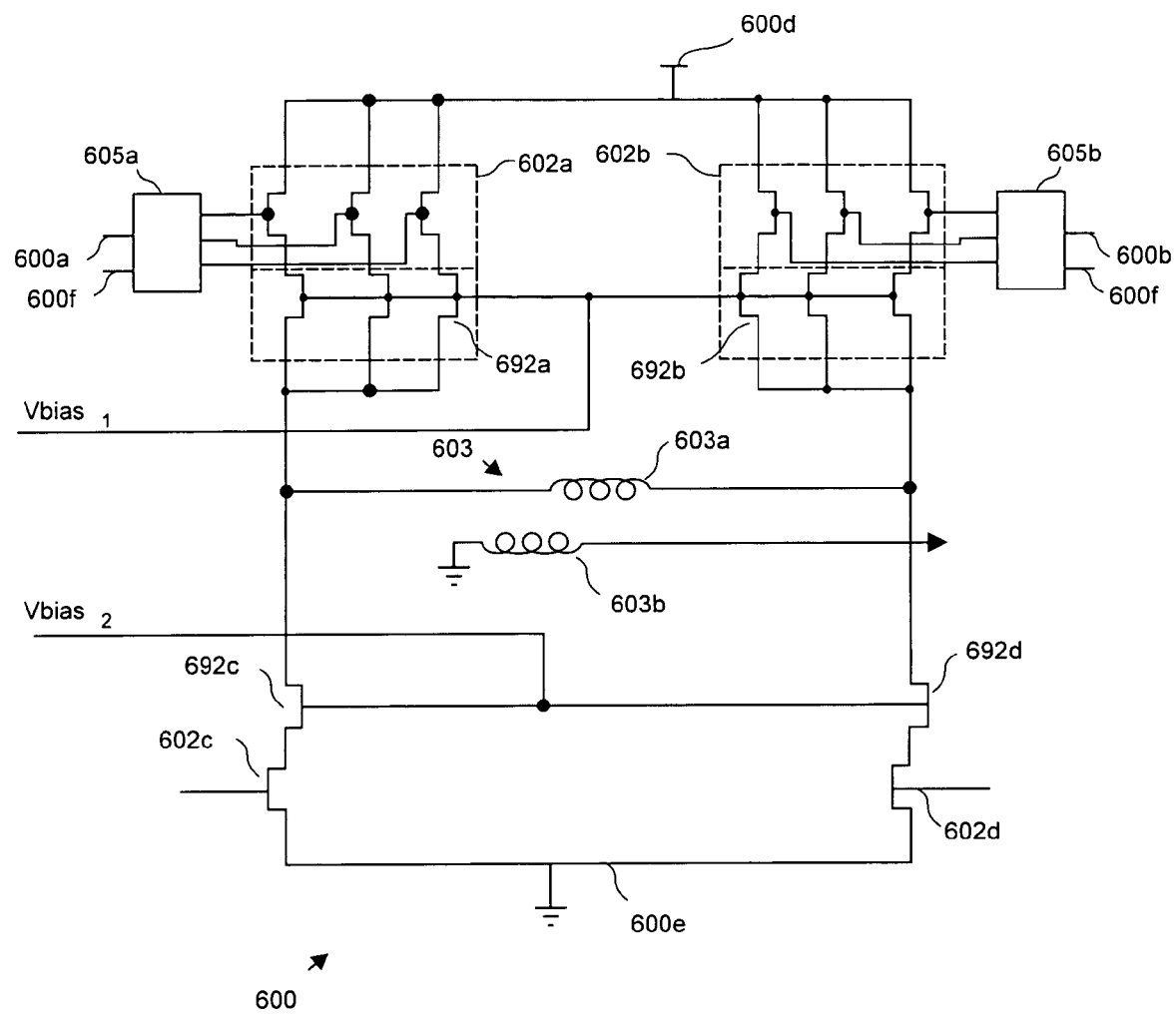
FIG. 6 illustrates a schematic diagram of an H-Bridge architecture amplifier having a cascode current mirror and a binary scaled switch array.

FIG. 6 illustrates a differential amplifier according to an embodiment of the invention for use in a signal generator circuit for generating a modulated signal at a known carrier frequency. An output stage 600 is provided in the form of a H-bridge that is disposed between first and second supply voltage ports, 600d and 600e. The H-bridge circuit 602 is formed from two circuit paths. A first circuit path has a first end thereof coupled with the first supply voltage port 600d, where a first side of a first high side driver circuit 602a is coupled thereto. Coupled to the second side of the first high side driver circuit 602a is a first end of a primary winding 603b of a transformer 603. Coupled to the second end of the primary winding 603b is a second low side driver circuit 602d, which is further coupled with the second supply voltage port 600e, terminating the first circuit path. Also disposed within the first circuit path is a plurality of first cascode transistors 692a and a plurality of fourth cascode transistors 692b each forming part of a different current mirror. Alternatively, each forms part of a same current mirror. The first high side driver 602a comprises an array of transistors disposed for switching current within the first circuit path each for switching a different amount of current with a binary scaled relation there between. A second circuit path has a first end thereof coupled with the first supply voltage port 600d, where a first side of a second high side driver circuit 602b is coupled thereto. Coupled to the second side of the second high side driver circuit 602b is a second end of the primary winding 603b of a transformer 603. Coupled to the first end of the primary winding 603b is a first low side driver circuit 602c, which is further coupled with the second supply voltage port 600e, terminating the second circuit path. Also disposed within the second circuit path is a second cascode transistor 692c and a third cascode transistor 692d each forming part of a different current mirror. Alternatively, each forms part of a same current mirror. Also within the second circuit path is an array of binary-scaled transistors 602b disposed for switching current within the second circuit path. Thus, the first and second circuit paths cross in the center of the H-bridge along the primary winding 603b. A secondary winding 603a of the transformer 603 is coupled with an external load (not shown) and used for providing of a high power modulated RF signal thereto.

The transmitter output stage 600 is provided with a first input port 600a and a second input port 600b. The first input port 600a is coupled with the first high side driver 602a and with the second low side driver 602d and the second input port 600b is coupled with the second high side driver 602b and the first low side driver 602c. Within each of the drivers, 602a through 602d, power control circuits, in the form of switching circuits 605a through 605d, are disposed, respectively. Switching circuits 605a are disposed between the first supply voltage port 600d and the first end of the primary winding 603b. Switching circuits 605b are disposed between the first supply voltage port 600d and the second end of the primary winding 603b. Switching circuits 605c are disposed between the second supply voltage port 600e and the first end of the primary winding 603b and switching circuits 605d are disposed between the second supply voltage port 600e and the second end of the primary winding 603b. Signal path delays within the signal-processing block 604 are approximately the same for the generation of the first and second output signals.

Switching circuit 602a comprises an array of binary-scaled switches each disposed in series with another transistor comprising part of the array of transistors 692a in cascode arrangement between a supply voltage port and one of the ends of the primary winding 603b. The power control circuit 605a within the high side driver is coupled with a same control port for receiving a power control signal for controlling the switching operation of each of the binary-scaled switches. The power control signal is in the form of a digital power control signal and is provided through a power control port 600*a* that is coupled with the power control circuit 605*a*. This digital power control signal is used for gating the first digital signal that is provided to the output stage 602*a*.

Switching circuit 602*b* comprises an array of binary-scaled switches each disposed in series with another transistor, which is part of an array of transistors 692*b* in cascode arrangement between a supply voltage port and one of the ends of the primary winding 603*b*. The power control circuit 605*b* within the high side driver is coupled with a same control port for receiving a power control signal for controlling the switching operation of each of the binary-scaled switches 692*b*. The power control signal is in the form of a digital power control signal and is provided through a power control port 600*b* that is coupled with the power control circuit 605*b*. This digital power control signal is used for gating the second digital signal that is provided to the output stage 602*b*. Each array of the binary-scaled switches thus controls the current level provided to the transformer 603 via one or more of the array of digitally selectable power flow paths. This gating determines the power level that is transmittable using the transmitter 600.

The binary scaling of the switches determines the current that each of switches from each array propagates, when closed. So for example, if there are four switches within each switching circuit, the switches are weighted in such a manner that the most significant bit enables opening and closing of the fourth switch and a least significant bit enables opening and closing of the first switch. When the fourth switch is closed it propagates eight times more current than the first switch, when closed. The third switch propagates four times more current than the first switch and the second switch propagates twice as much current as the first switch. The digital control signal is used for controlling each of the switches. For the four switches, a four bit digital value is used to control the operation thereof providing 16 switchably selectable different current levels. Of course, four switches is only an example and of course any number of switches are optionally implemented in order to meet the power requirements of the transmitter 600. Preferably each of the switches are MOS devices where an amount of current that each switch propagates when closed is determined by an area of the MOS device(s) that forms the switch. The power control circuit, 605*a* and 605*b*, are used to adjust the RF output signal power for transmission. Typically, this adjustment is performed at relatively slow and infrequent transitions, though it is feasible to use this for signal modulation. Potentially, when the power control circuits 605*a* and 605*b* are used for signal modulation, small amplitude steps result in additional amplitude modulation noise in the RF output signal. This additional noise can be compensated for either with pre-compensation or post-compensation based on a control circuit.

A signal processing circuit (not shown) is used for providing of first and second digital signals to the first and second output stage input ports 600*a*, 600*b* A relative phase between the first and second digital signals determines the amplitude for the RF output signal and the absolute phase determines the phase modulation. The amplitude modulation is applied to the RF output signal by controlling the relative phasing of the first and second digital signals and thus generates smoother amplitude transitions, which results in a cleaner transmit spectrum.

Advantageously, the transmitter circuit 600 allows for controlling of the RF output signal power without adjusting the biasing of the signal generating circuit. Instead, amplitude and phase modulation is controlled by a pulse width modulator circuit that is controlled using time alignment circuits implemented in, for example, a digital technology. The resulting control signals are summed in a constructive/destructive fashion across the transformer to result in the pulse width modulated signal. This approach provides greater repeatability and reliability than the analog control techniques. Alternatively, amplitude modulation is controlled by both phase modulation and by varying the current levels through the transformer. Once the pulse width modulated signal is generated, it is optionally filtered using a filter circuit to produce an amplitude-modulated signal at the known carrier frequency. Alternatively, filtering is a result of characteristics of a load in the form of a radiator for radiating the signal. Alternatively, the load is in the form of a cable for conducting the signal.

Signal processing within the signal processing circuit (not shown) is used to create the first digital signal 600*a* and the second digital signal 600*b* that are provided to the output stage 602. Optionally, switches within each array of binary-scaled switches are turned on and off in a predetermined manner in relation to time to create a predetermined power profile. The turn-on and turn-off profile of the switches is relates to the ramp on or the ramp off for the PA (terms used in cellular communication). Peak power at any time is determined by a number of switches that are turned on within each switch array and the amplitude modulation for the output stage is determined by the phasing between the first and second digital signals that are provided to the output stage 602. Further optionally, the array of switches is other than binary arrayed.

The transmitter circuit 600 above enables the amplitude modulation of the output signal by using pulse width modulation, through the control of the phase of the first and second digital signals, where the output stage 602 combines the two digital signals without the need for an independent combiner circuit. Through the use of a plurality of switching circuits, which are individually switchably selectable, a segmented output architecture is provided that enables RF output signal power control through selecting a number of switching elements that are to be switched. Within the output stage 602 the digital signals are combined without the use of a separate power combiner. Optionally, an attenuator circuit is used in conjunction with the smallest current switching circuit to extend the power control range for the transmitter 600. Further optionally, the output signal power control is also used for amplitude modulation along with the pulse width modulation in order to extend the range over which amplitude modulation is reversibly encoded within the signal.

Figure 7:
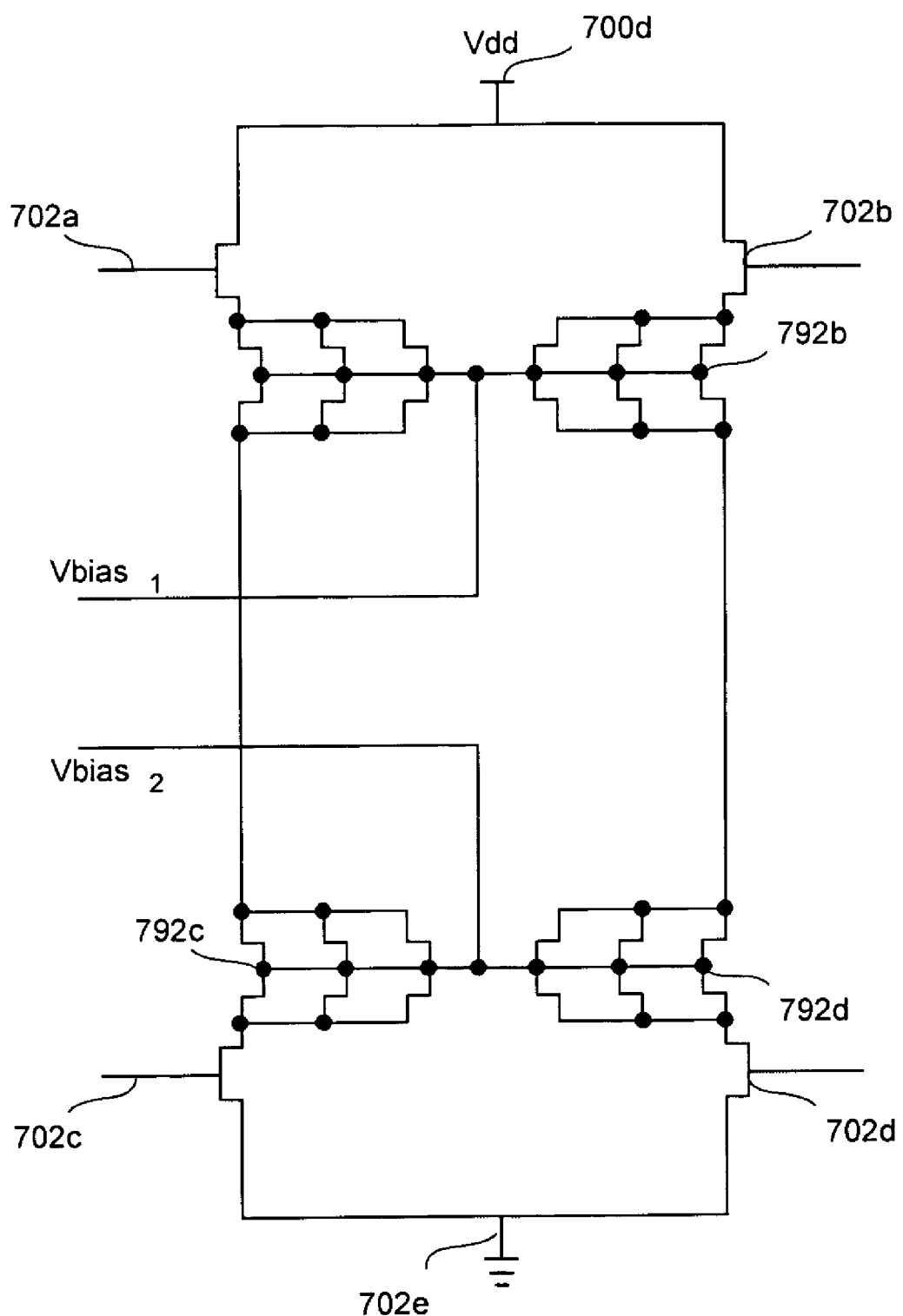
FIG. 7 illustrates an H-bridge circuit having a plurality of parallel current mirrors for controlling current flow within each path.

In an alternative embodiment, data provided to the transmitter 600 includes data relating to a RF frequency to be transmitted, the phase information for the modulated signal, and amplitude information for the signal to be generated, which is to be decomposed into 'modulation' and the desired RF level, and/or data that describes the modulation scheme and data to be transmitted Referring to FIG. 7, shown is an H-bridge circuit having a plurality of parallel current mirrors for controlling current flow within the path. An output stage 702 is provided in the form of a H-bridge that is disposed between first and second supply voltage ports, 700*d* and 700*e*. The H-bridge circuit 702 is formed from two circuit paths. A first circuit path has a first end thereof coupled with the first supply voltage port 700*d*, where a first side of a first high side driver circuit 702*a* is coupled thereto. Coupled to the second side of the first high side driver circuit 702*a* is a first current limiting circuit 792*a* in the form of a plurality of transistors disposed in parallel and forming part of a current mirror. A bias of the plurality of transistors is provided by a bias circuit. The first current limiting circuit is disposed between the first high side driver circuit and a first end of a primary winding 703*b* of a transformer 703. Coupled to the second end of the primary winding 703*b* is a fourth current limiting circuit 792*d* in the form of a plurality of transistors disposed in parallel and forming part of a current mirror. A bias of the plurality of transistors is provided by a bias circuit. The fourth current limiting circuit 792*d* is coupled to a second low side driver circuit 702*d*, which is further coupled with the second supply voltage port 700*e*, terminating the first circuit path.

A second circuit path has a first end thereof coupled with the first supply voltage port 700*d*, where a first side of a second high side driver circuit 702*b* is coupled thereto. Coupled to the second side of the second high side driver circuit 702*b* is a second current limiting circuit 792*a* in the form of a plurality of transistors disposed in parallel and forming part of a current mirror. A bias of the plurality of transistors is provided by a bias circuit. The second current limiting circuit is disposed between the second high side driver circuit 702*b* and a second end of a primary winding 703*b* of a transformer 703. Coupled to the first end of the primary winding 703*b* is a third current limiting circuit 792*c* in the form of a plurality of transistors disposed in parallel and forming part of a current mirror. A bias of the plurality of transistors is provided by a bias circuit. The second current limiting circuit 792*c* is coupled to a first low side driver circuit 602*c*, which is further coupled with the second supply voltage port 700*e*, terminating the second circuit path. Thus, the first and second circuit paths cross in the center of the H-bridge along the primary winding 703*b*. A secondary winding 703*a* of the transformer 703 is coupled with an external load (not shown) and used for providing of a high power modulated RF signal thereto.

Figure 8:
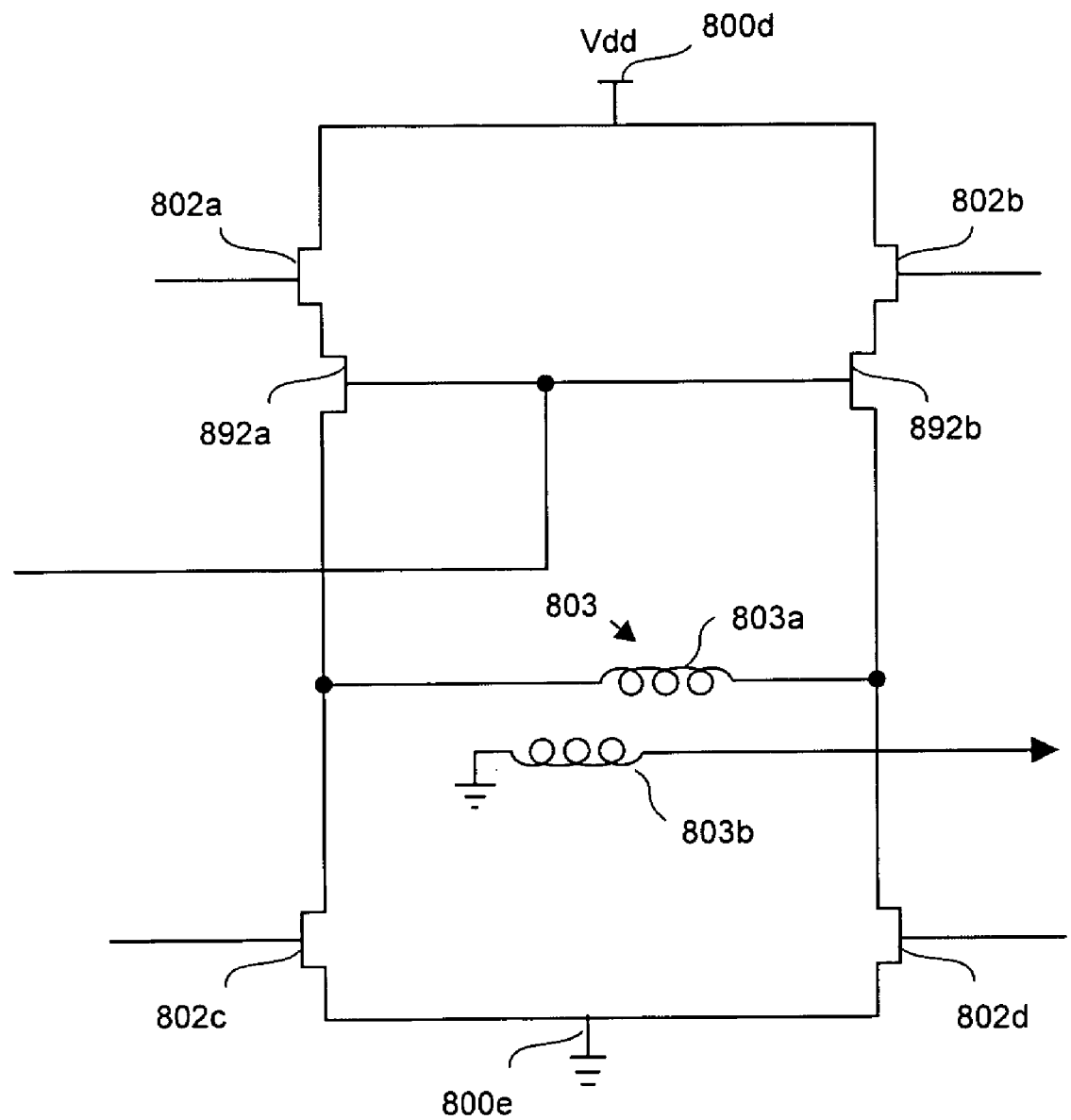
FIG. 8 illustrates an H-bridge circuit having a single current limiting device within a high side of each of two paths.

Referring to FIG. 8, shown is an H-bridge circuit having only one current mirror therein. The H-bridge circuit comprises a first high side driver 802*a* and a first other transistor 892*a* coupled in cascode arrangement, a second high side driver 802*b* and a second other transistor 892*b* coupled in cascode arrangement. The first other transistor and the second other transistor having a common bias. A transformer 803 bridges an output port of each of the first other transistor 892*a* and the second other transistor 892*b*. Also shown is a first low side driver 802*c* coupled between the transformer 803 and ground 800*e* and a second low side driver 802*d* coupled between a second side of the transformer 803 and ground 800*e*.

Figure 9:
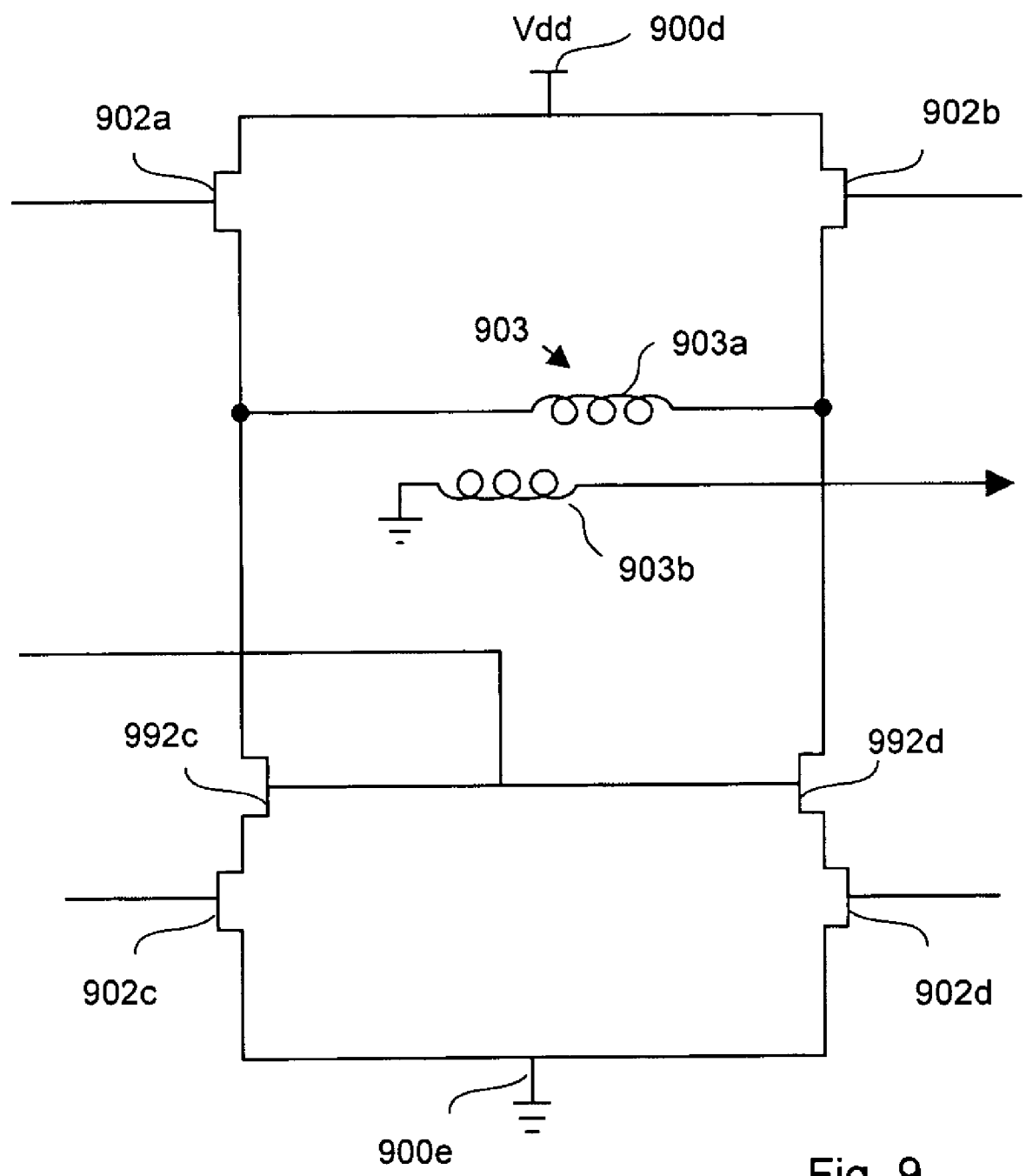
FIG. 9 illustrates an H-bridge circuit having a single current limiting device within a low side of each of two paths.

Referring to FIG. 9, shown is an H-bridge circuit having only one current mirror therein. The H-bridge circuit comprises a first high side driver 902*a* and a second high side driver 902*b*. A transformer 903 bridges an output port of each of the high side drivers. A first low side driver 902*c* is shown in cascode arrangement with a first other transistor 992*c* coupled between the transformer 903 and ground 900*e*. A second low side driver 902*d* disposed in cascode arrangement with a second other transistor 992*d* and coupled between a second side of the transformer 903 and ground 900*e*. The first other transistor and the second other transistor have a common bias.

Figure 10:
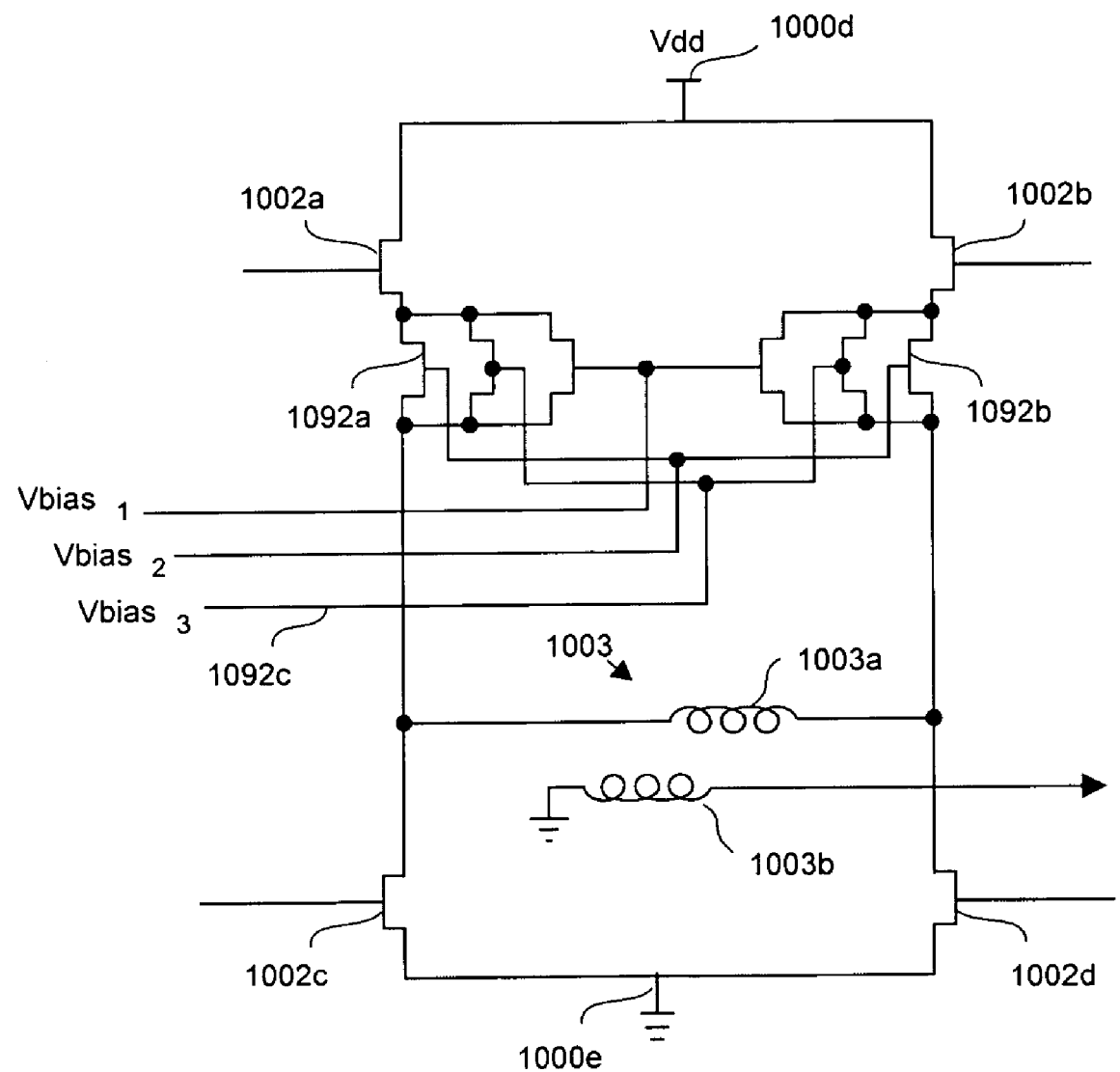
FIG. 10 illustrates an H-bridge circuit having a plurality of current mirrors disposed in parallel within a high side of the circuit.

Referring to FIG. 10, shown is an H-bridge circuit having only one current mirror therein. The H-bridge circuit comprises a first high side driver 1002*a* and a plurality of first other transistors 1092*a* coupled in parallel and in cascode arrangement with the first high side driver 1002*a*. A second high side driver 1002*b* and a plurality of second other transistors 1092*b* coupled in parallel and in cascode arrangement with the second high side driver 1002*b*. The plurality of first other transistors 1092*a* and the plurality of second other transistors 1092*b* are biased in pairs with each pair biased by a different bias control line 1092*c*. A transformer 1003 bridges an output port of each of the plurality of first other transistors 1092*a* and the plurality of second other transistors 1092*b*. Also shown is a first low side driver 1002*c* coupled between the transformer 1003 and ground 1000*e* and a second low side driver 1002*d* coupled between a second side of the transformer 1003 and ground 1000*e*.

Figure 11:
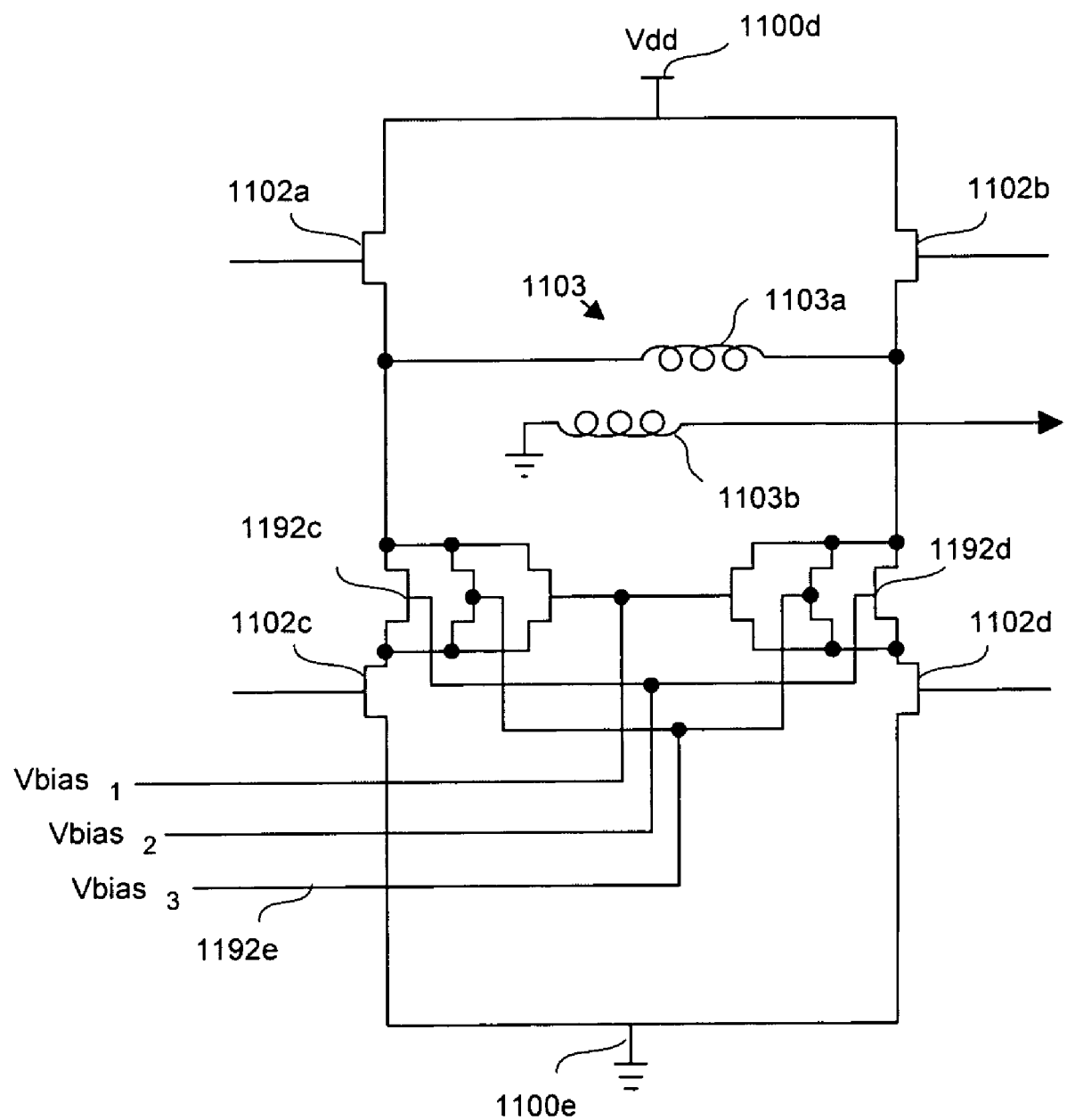
FIG. 11 illustrates an H-bridge circuit having a plurality of current mirrors disposed in parallel within a low side of the circuit.

Referring to FIG. 11, shown is an H-bridge circuit having only one current mirror therein. The H-bridge circuit comprises a first high side driver 1102*a* and a second high side driver 1102*b*. A transformer 1103 bridges an output port of each of the high side drivers. A first low side driver 1102*c* and a plurality of first other transistors 1192*c* coupled in parallel and in cascode arrangement with the first low side driver 1002*c* are coupled between the transformer 1103 and ground 1100*e*. A second low side driver 1102*d* disposed in cascode arrangement with a plurality of second other transistors 1192*d* disposed in parallel are coupled between a second side of the transformer 1103 and ground 1100*e*. The plurality of first other transistors 1192*c* and the plurality of second other transistors 1192*d* are biased in pairs with each pair biased by a different bias control line 1192*e*.

Figure 12:
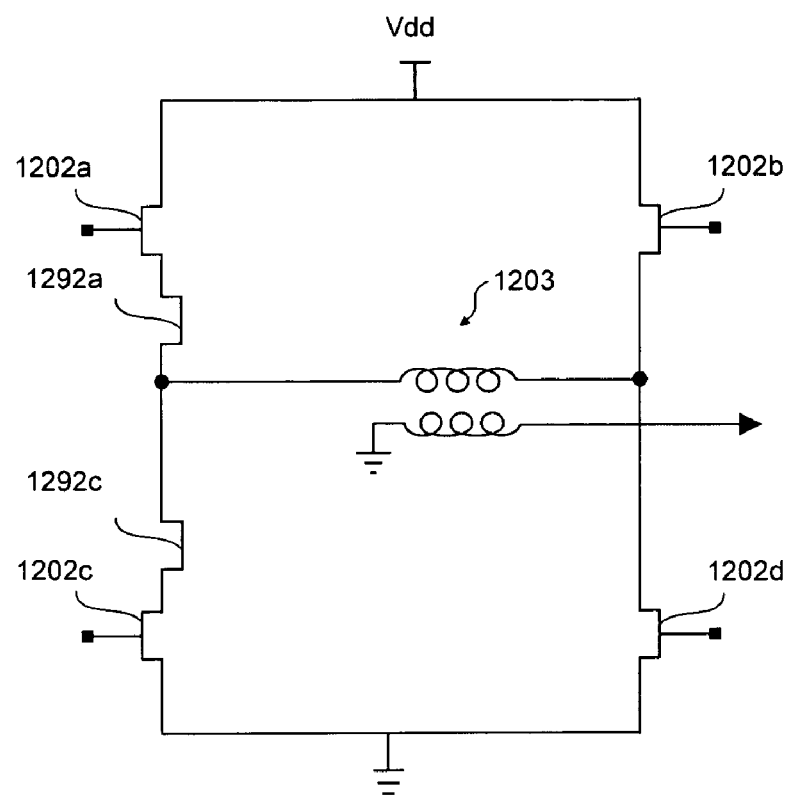
FIG. 12 illustrates an H-bridge having a single current limiting device within each of two paths, a first current limiting device within a high side of one path and a second current limiting device within a low side of another path; and, FIG. 13 illustrates an exemplary half H-bridge configuration.

Referring to FIG. 12, shown is an H-bridge circuit having two cascode transistors one in the high side and the other in the low side of different switchable circuit paths. The H-bridge circuit comprises a first high side driver 1202*a* and a first other transistor 1292*a* coupled in cascode arrangement, and a second high side driver 1202*b*. The first other transistor having a first bias. A transformer 1203 bridges an output port of each of the first other transistor 1292*a* and the second high side driver 1202*b*. Also shown is a first low side driver 1202*c* disposed in cascode arrangement with a second other transistor 1292*c* and coupled between the transformer 1203 and ground 1200*e* and a second low side driver 1202*d* coupled between a second side of the transformer 1203 and ground 1200*e*.

Figure 13:
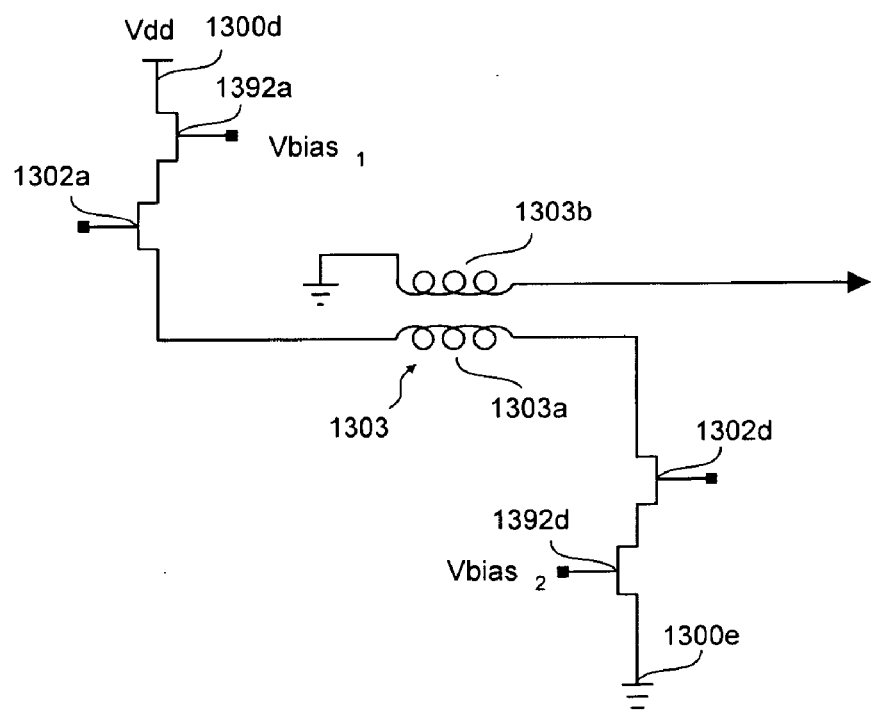

Though the above embodiments each show an H-bridge architecture, the invention is also applicable to a half H-bridge. Referring to FIG. 13, shown is a half H-bridge having a first high side switching transistor 1302*a* and a first high side cascode transistor 1392*a* disposed in series between a first supply voltage port 1300*d* and a first end of a first winding 1303*a* of a transformer 1303. A first low side switching transistor 1302*d* and a first low side cascode transistor 1392*d* are disposed in series between a second supply voltage port 1300*e* and a second end of the first winding 1303*a* of the transformer 1303. Thus, the circuit provides control over current flowing within the second winding 1303*b* of the transformer 1303 by switching of the switches 1302*a* and 1302*d*. Of course, a half H-bridge embodiment is also an applicable modification to the other embodiments of the invention described herein above.

Although transistor sizes are not shown and current limiting transistors when disposed in parallel are shown having identical biases applied thereto, the invention is also applicable to transistors having different sizes disposed in parallel and to applying different biases to different transistors for limiting current. Thus, for example in the embodiment of FIG. 6, when each current limiting transistor is differently biased for supporting a different amount of current flow there through, the switches each act to switch different current flows allowing for finer or more coarse control over current flowing within the amplifier circuit current flow path. Of course, to support such an embodiment, each of the transistor pairs is coupled to a separate biasing circuit. Further, though the circuit of FIG. 3 is shown for generating two biases, a circuit for generating one bias or several biases is also within the scope of the invention.

Numerous other embodiments may be envisaged without departing from the spirit or scope of the invention.

What is claimed is:

1. A circuit comprising:
a first transformer port;
a second transformer port;
a voltage supply port;
a voltage sink port;
a first switch electrically disposed between the voltage supply port and the first transformer port;
a second switch electrically disposed between the voltage supply port and the second transformer port;
a third switch electrically disposed between the voltage sink port and the first transformer port;
a fourth switch electrically disposed between the voltage sink port and the second transformer port;
a first cascode transistor disposed in cascode arrangement with one of the first switch, the second switch, the third switch, and the fourth switch; and
a biasing circuit for biasing the first cascode transistor with a bias signal, the bias signal resulting in a current flow through the first cascode transistor that is temperature invariant.

2. A circuit according to claim 1 wherein the switch is at least one of a switching transistor, a CMOS transistor, and an element of an integrated circuit.

3. A circuit according to claim 1 comprising:
a first transformer comprising a first winding and a second winding, the first winding coupled at one end thereof to the first transformer port and at another end thereof to the second transformer port, wherein the first winding of the transformer forms
a first circuit path comprising the first switch, the first winding, and the fourth switch, and a second circuit path comprising the second switch, the first winding, and the third switch,
the first circuit path and the second circuit path for driving the transformer with opposite polarity.

4. A circuit according to claim 3 wherein
the first switch and the fourth switch for switching current to flow within the first circuit path, and
the second switch and the third switch for switching current to flow within the second circuit path.

5. A circuit according to claim 4 wherein the first switch and the first cascode transistor are for limiting current flowing within one of the first circuit path and the second circuit path.

6. A circuit according to claim 5 comprising a control circuit for providing a control signal to the first cascode transistor for controlling current flowing therethrough.

7. A circuit according to claim 3 comprising a load, wherein the second winding of the transformer is coupled to the load.

8. A circuit according to claim 7 wherein the load comprises at least one of an RF radiator and an RF cable.

9. A circuit according to claim 1 wherein the circuit is at least one of integrated within a single semiconductor die, is integrated within a single semiconductor die manufactured according to a CMOS process, is integrated within a single semiconductor die with the exception of the transformer, and is integrated into a single semiconductor die comprising at least one of a silicon and gallium arsenide substrate.

10. A claim according to claim 1 wherein the transformer is at least one of a discrete component and integrated as part of a second semiconductor die.

11. A circuit according to claim 1 wherein the transformer comprises a ceramic substrate.

12. A circuit according to claim 1 comprising:
a second cascode transistor disposed in cascode arrangement with one of the second switch and the third switch, wherein the first cascode transistor is disposed in cascode arrangement with one of the first switch and the fourth switch.

13. A circuit according to claim 12 wherein the first cascode transistor and the second cascode transistor have gates thereof coupled together for each receiving a same bias signal.

14. A circuit according to claim 1, comprising:
a second cascode transistor disposed in cascode arrangement with the second transistor;
a third cascode transistor disposed in cascode arrangement with the third transistor; and,
a fourth cascode transistor disposed in cascode arrangement with the fourth transistor,
wherein the first cascode transistor is disposed in cascode arrangement with the first transistor.

15. A circuit according to claim 14 wherein the first cascode transistor and the second cascode transistor have gates thereof coupled together for each receiving a same bias signal and wherein the third cascode transistor and the fourth cascode transistor have gates thereof coupled together for each receiving a same bias signal.

16. A circuit according to claim 15 comprising a bias circuit wherein the bias circuit is for providing a first bias signal to the first current mirror and a second other bias signal to the second current mirror.

17. A circuit according to claim 3 comprising:
a second cascode transistor disposed in cascode arrangement with one of the second switch and the third switch, wherein the first cascode transistor is disposed in cascode arrangement with one of the first switch and the fourth switch, each of the first cascode transistor and the second cascode transistor for limiting current flowing within one of the first circuit path and the second circuit path.

18. A circuit according to claim 17 wherein the first cascode transistor and the second cascode transistor are coupled for forming a current mirror.

19. A circuit according to claim 3, comprising:
a second cascode transistor disposed in cascode arrangement with the second transistor;
a third cascode transistor disposed in cascode arrangement with the third transistor; and,
a fourth cascode transistor disposed in cascode arrangement with the fourth transistor,
wherein the first cascode transistor is disposed in cascode arrangement with the first transistor.

20. A circuit according to claim 19 wherein the first cascode transistor and the second cascode transistor are coupled for forming a first current mirror and wherein the third cascode transistor and the fourth cascode transistor are coupled for forming a second current mirror.

21. A circuit according to claim 20 comprising a bias circuit wherein the bias circuit is for providing a first bias signal to the first current mirror and a second other bias signal to the second current mirror.

22. A circuit according to claim 3, wherein the first circuit path and the second circuit path form a power amplifier circuit having an H-bridge architecture.

23. A circuit according to claim 22 wherein a first signal provided to the first switch and a fourth signal provided to the fourth switch are at least one of the same drive signal and different drive signals.

24. A computer readable medium having stored therein data according to a predetermined computing device format, and upon execution of the data by a suitable computing device a circuit design is provided, comprising:
a first transformer port;
a second transformer port;
a voltage supply port;
a voltage sink port;
a first switch electrically disposed between the voltage supply port and the first transformer port;
a second switch electrically disposed between the voltage supply port and the second transformer port;
a third switch electrically disposed between the voltage sink port and the first transformer port;
a fourth switch electrically disposed between the voltage sink port and the second transformer port; and
a first cascode transistor disposed in cascode arrangement with one of the first switch, the second switch, the third switch, and the fourth switch; and
a biasing circuit for biasing the first cascode transistor with a bias signal, the bias signal resulting in a current flow through the first cascode transistor that is temperature invariant.

25. A storage medium according to claim 24 having stored therein data for when executed resulting in a circuit design comprising:
a first transformer comprising a first winding and a second winding, the first winding coupled at one end thereof to the first transformer port and at another end thereof to the second transformer port, wherein the first winding of the transformer forms
a first circuit path comprising the first switch, the first winding, and the fourth switch, and a second circuit path comprising the second switch, the first winding, and the third switch,
the first circuit path and the second circuit path for driving the transformer with opposite polarity.

26. A storage medium according to claim 24 having stored therein data for when executed resulting in a circuit design comprising:
a second cascode transistor disposed in cascode arrangement with the second transistor;
a third cascode transistor disposed in cascode arrangement with the third transistor; and,
a fourth cascode transistor disposed in cascode arrangement with the fourth transistor,
wherein the first cascode transistor is disposed in cascode arrangement with the first transistor.

27. A storage medium according to claim 26 having stored therein data for when executed resulting in a circuit design comprising:
a first transformer comprising a first winding and a second winding, the first winding coupled at one end thereof to the first transformer port and at another end thereof to the second transformer port, wherein the first winding of the transformer forms
a first circuit path comprising the first switch, the first winding, and the fourth switch, and a second circuit path comprising the second switch, the first winding, and the third switch,
the first circuit path and the second circuit path for driving the transformer with opposite polarity.

28. A method of providing a drive signal for driving a load comprising:
providing a push pull amplifier having switching transistors and cascode transistors disposed in cascode arrangement therein;
limiting current flowing through switched current flow paths by biasing the cascode transistors; and,
switching current within the switched current flow paths by switching of the switching transistors.

29. A method according to claim 28 wherein the push pull amplifier comprises an amplifier having an H-bridge architecture.

30. A method according to claim 29 wherein switching current supports current flow in each of two different directions through a transformer, switching of the current for driving a signal onto an output port of the circuit, the output port on an opposite side of the transformer from the switched current flow paths.

31. A method according to claim 28 wherein the cascode transistors are disposed for forming at least a current mirror.

32. A circuit comprising:
a first transformer port;
a second transformer port;
a voltage supply port;
a voltage sink port;
a first switch electrically disposed between the voltage supply port and the first transformer port;
a second switch electrically disposed between the voltage supply port and the second transformer port;
a third switch electrically disposed between the voltage sink port and the first transformer port;
a fourth switch electrically disposed between the voltage sink port and the second transformer port;
a first transformer comprising a first winding and a second winding, the first winding coupled at one end thereof to the first transformer port and at another end thereof to the second transformer port, wherein the first winding of the transformer forms
a first circuit path comprising the first switch, the first winding, and the fourth switch, the first switch and the fourth switch for switching current to flow within the first circuit path with a first polarity; and
a second circuit path comprising the second switch, the first winding, and the third switch, the second switch and the third switch for switching current to flow within the second circuit path with a second opposite polarity; and
a first cascode transistor disposed in cascode arrangement with the first switch, the first switch and the first cascode transistor for limiting current flowing within the first circuit path.

33. A circuit according to claim 32 wherein the switch is a switching transistor.

34. A circuit according to claim 33 wherein the switching transistor is at least one of an element within an integrated circuit and a CMOS device.

35. A circuit according to claim 32 comprising a control circuit for providing a control signal to the first cascode transistor for controlling current flowing therethrough.

36. A circuit according to claim 32 comprising a load, wherein the second winding of the transformer is coupled to the load.

37. A circuit according to claim 36 wherein the load comprises at least one of an RF radiator and an RF cable.

38. A circuit according to claim 32 wherein the circuit is at least one of integrated within a single semiconductor die, integrated within a single semiconductor die manufactured with a CMOS process, is integrated within a single semiconductor die with the exception of the transformer, is integrated within a single semiconductor die comprising at least one of a silicon and gallium arsenide substrate.

39. A claim according to claim 32 wherein the transformer is at least one of a discrete component, a transformer comprising a ceramic substrate, and integrated as part of a second semiconductor die.

40. A circuit according to claim 32 comprising:
a second cascode transistor disposed in cascode arrangement with one of the second switch and the third switch, wherein the first cascode transistor is disposed in cascode arrangement with one of the first switch and the fourth switch.

41. A circuit according to claim 40 wherein the first cascode transistor and the second cascode transistor have gates thereof coupled together for each receiving a same bias signal.

42. A circuit according to claim 32, comprising:
a second cascode transistor disposed in cascode arrangement with the second transistor;
a third cascode transistor disposed in cascode arrangement with the third transistor; and,
a fourth cascode transistor disposed in cascode arrangement with the fourth transistor,
wherein the first cascode transistor is disposed in cascode arrangement with the first transistor.

43. A circuit according to claim 42 wherein the first cascode transistor and the second cascode transistor have gates thereof coupled together for each receiving a same bias signal and wherein the third cascode transistor and the fourth cascode transistor have gates thereof coupled together for each receiving a same bias signal.

44. A circuit according to claim 43 comprising a bias circuit wherein the bias circuit is for providing a first bias signal to the first current mirror and a second other bias signal to the second current mirror.

45. A circuit according to claim 32 comprising:
a second cascode transistor disposed in cascode arrangement with one of the second switch and the third switch, wherein the first cascode transistor is disposed in cascode arrangement with one of the first switch and the fourth switch, each of the first cascode transistor and the second cascode transistor for limiting current flowing within one of the first circuit path and the second circuit path.

46. A circuit according to claim 45 wherein the first cascode transistor and the second cascode transistor are coupled for forming a current mirror.

47. A circuit according to claim 32 comprising:
a second cascode transistor disposed in cascode arrangement with the second transistor;
a third cascode transistor disposed in cascode arrangement with the third transistor; and,
a fourth cascode transistor disposed in cascode arrangement with the fourth transistor,
wherein the first cascode transistor is disposed in cascode arrangement with the first transistor.

48. A circuit according to claim 47 wherein the first cascode transistor and the second cascode transistor are coupled for forming a first current mirror and wherein the third cascode transistor and the fourth cascode transistor are coupled for forming a second current mirror.

49. A circuit according to claim 48 comprising a bias circuit wherein the bias circuit is for providing a first bias signal to the first current mirror and a second other bias signal to the second current mirror.

50. A circuit according to claim 32, wherein the first circuit path and the second circuit path form a power amplifier circuit having an H-bridge architecture.

51. A circuit according to claim 50 wherein a first signal provided to the first switch and a fourth signal provided to the fourth switch are the same drive signal.

52. A circuit according to claim 50 wherein a first signal provided to the first switch and a fourth signal provided to the fourth switch are different drive signals.

53. A circuit according to claim 32 comprising a biasing circuit for biasing of the first cascade transistor.

54. A circuit according to claim 53 wherein the biasing circuit provides a bias signal for resulting in a current flow through the first cascade transistor that is temperature invariant.

* * * * *